PIEZOELECTRIC CERAMIC MATERIALS

Filed Oct. 25, 1967 2 Sheets-Sheet 1

Kazunobu Kurihara
Nobuo Ichinose
Hirotaka Yokoyama
Katsunori Yokoyama
INVENTORS

BY George B. Oujevolk
Attorney

Kazunobu Kurihara
Nobuo Ichinose
Hirotaka Yokoyama
Katsunori Yokoyama
INVENTORS

BY George B. Oujevolk
Attorney

United States Patent Office 3,468,799
Patented Sept. 23, 1969

3,468,799
PIEZOELECTRIC CERAMIC MATERIALS

Kazunobu Kurihara, Noboru Ichinose, Hirotaka Yokoyama, and Katsunori Yokoyama, Yokohama-shi, Japan, assignors to Tokyo Shibaura Electric Co., Ltd., Kawasaki-shi, Japan, a corporation of Japan Filed Oct. 25, 1967, Ser. No. 678,009
Claims priority, application Japan, Oct. 28, 1966, 41/70,670
Int. Cl. C04b 35/48, 35/46
U.S. Cl. 252—62.9 2 Claims

ABSTRACT OF THE DISCLOSURE

A piezoelectric ceramic material consisting of 40 to 50 mol percent of $PbTiO_3$, 0.5 to 6 mol percent of a compound expressed by a general formula $$Sr(MeNb)_{0.5}O_3$$

where Me being an element selected from the group consisting of In, Y, La, Nd, Sm, Eu, Gd, Tb, Dy, Ho, Er, Tm, Yb and Lu, and the remainder of $PbZrO_3$. The material is characterised by its high electro-mechanical coupling coefficient of more than 40% and a high bulk density of more than 7.5 g./cm.$^3$.

This invention relates to piezoelectric materials having piezo-effect and more particularly to ferroelectric ceramic material of the lead-zirconium-titanium series.

One of the known piezoelectric materials consists of a solid solution of lead titanate and lead zirconate which is represented by the following general formula:

$$Pb[Ti_xTr_{(1-x)}]O_3 \quad (1)$$

This material, however, has a poor electro-mechanical coupling coefficient, for example, less than 40%, even when the material consists of a composition shown by said general formula wherein $x$ is in a range of from 0.45 to 0.50 which exhibit the most favorable piezoelectric characteristic due to a morphotropic phase transition.

Materials having compositions represented by the following general Formulae 2 and 3 which are modifications of said Formula 1, $$Pb(Ti_{x'}Zr_{(1-x'-y')}Sn'O_3 \quad (2)$$

$$Pb(Ti_{(1-a-b)}Zr_aSn_b)O_3 \quad (3)$$

and material having compositions wherein a portion of Pb of the compositions represented by said Formulae 1 and 3 are replaced by less than 30 mol percent of Sr, Ba or Ca are also known in the art. Although these materials have improved electro-mechanical coupling coefficient over the material of the composition represented by Formula 1 when powders of constituents of these compositions are sintered by powder metallurgy technique to obtain ceramic articles, high sintering temperatures are required owing to their insufficient sinterability and yet sintered articles obtained have relatively large porosity.

It has been proposed to incorporate oxides of trivalent or pentavalent metals such as $Sb_2O_3$ and $Nb_2O_5$ to the composition shown by Formula 1. These materials accompany evaporation loss of PbO component which has the lowest boiling point during its sintering, and changes in the composition will cause the desired piezoelectric characteristic to vary.

This invention contemplates to provide a novel piezoelectric ceramic material of lead zirconate-lead titanate series consisting of 40 to 50 mol percent of $PbTiO_3$, 0.5 to 6 mol percent of $Sr(MeNb)_{0.5}O_3$ (where Me represents an element selected from the group consisting of In, Y, La, Nd, Sm, Eu, Gd, Tb, Dy, Ho, Er, Tm, Yb and Lu) and the remainder of $PbZrO_3$. A portion of $PbTiO_3$ may be substituted by less than 10 mol percent, based on the total mol percent of the material, of $SrTiO_3$.

When sintered under ordinary temperature conditions, the piezoelectric material shows high electro-mechanical coupling coefficients of more than 40% and high bulk densities of more than 7.5 g./cm.$^3$.

This invention can be more fully understood from the following detailed description taken in connection with the accompanying drawings, in which.

The proportion of each component of the novel piezoelectric ceramic material is selected to give sufficient physical properties, especially high electro-mechanical coupling coefficient to the materials.

Figure 1:
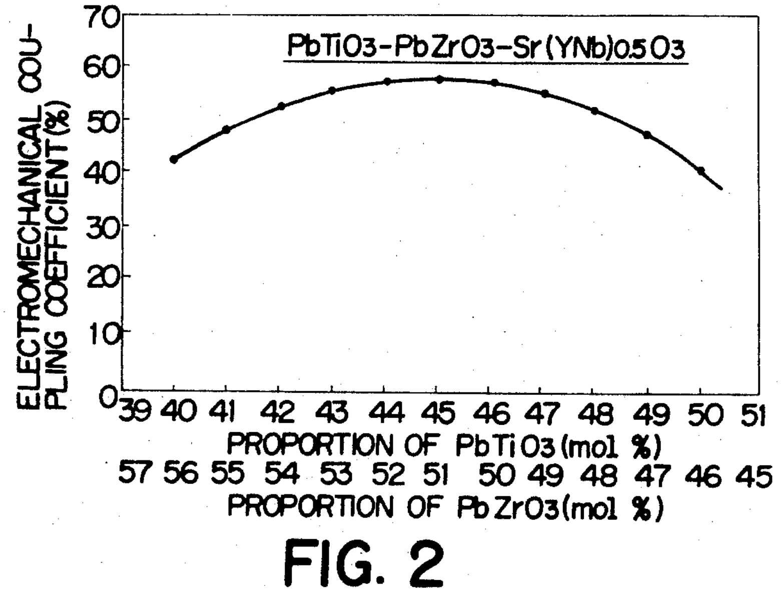
FIG. 1 shows a graph representing the relation between electro-mechanical coupling coefficient and varying ratios of $PbTiO_3$ and $PbZrO_3$ of the novel piezoelectric material.

When the material contains 40 to 50 mol percent of $PbTiO_3$ component it has electro-mechanical coupling coefficient Kr of more than 40% suitable for many practical applications. For example, FIG. 1 shows variation in Kr for various proportions of $PbTiO_3$ and $PbZrO_3$ in a composition containing 4 mol percent of $Sr(MeNb)_{0.5}O_3$ in the form of $Sr(YNb)_{0.5}O_3$. In this composition, proportions of $PbTiO_3$ of 45% and $PbZrO_3$ of 51% give highest Kr whereas $PbTiO_3$ of less than 40% and in excess of 50% lowers Kr to less than 40%.

Figure 2:
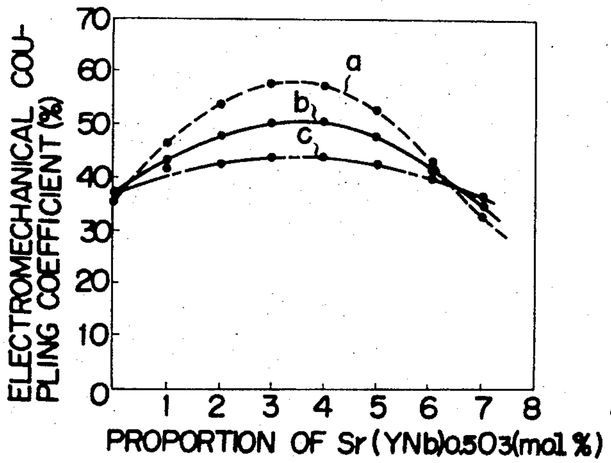
FIG. 2 is a graph showing the relation between electro-mechanical coupling coefficient and $Sr(YNb)_{0.5}O_3$ for three types of the novel materials.

In order that the piezoelectric material may have desirable Kr of more than 40%, the proportion of $Sr(MeNb)_{0.5}O_3$ should be in a range of from 0.5 to 6 mol percent. FIG. 2 shows the relation between $Sr(MeNb)_{0.5}O_3$ and Kr. In this figure, curve A shows the result of measurement about a material consisting of 45.0 mol percent of $PbTiO_3$, various amount of $Sr(MeNb)_{0.5}O_3$ and the remainder of $PbZrO_3$, curve B shows the result of a material of the similar composition except that the proportion of $PbTiO_3$ is 48.0 mol percent and curve C shows that of a material containing 41.0 mol percent of $PbTiO_3$. As can be noted from these curves materials containing from 0.5 to 6 mol percent of $Sr(MeNb)_{0.5}O_3$ exhibit a value of Kr exceeding 40%.

In materials represented by the general formula $Sr(TeNb)_{0.5}O_3$, Me represents an element selected from the group consisting of In, Y, La, Nd, Sm, Eu, Gd, Tb, Dy, Ho, Er, Tm, Yb and Lu. Each of these elements belongs to Group III of the periodic table and when incorporated into the material according to said general formula greatly improves Kr.

Figure 3:
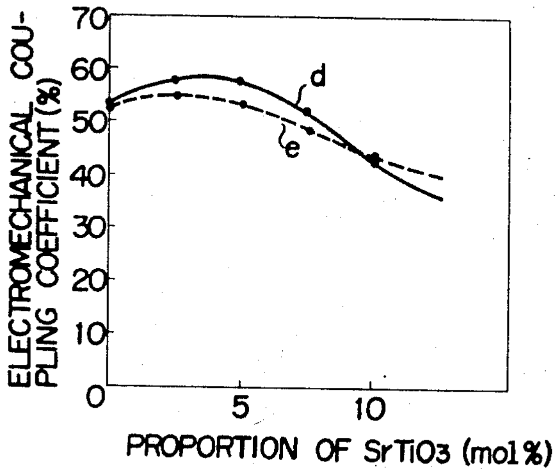
FIG. 3 is a graph to show the electro-mechanical coupling coefficient of two novel materials, a portion of $PbTiO_3$ thereof has been replaced by varying amount of $SrTiO_3$.

A portion of $PbTiO_3$ may be replaced by $SrTiO_3$ of the amount not exceeding 10 mol percent of the material as a whole. Materials containing $SrTiO_3$ within this range provide excellent Kr of more than 40% together with improved value of dielectric constant. It was found that although increase in the proportion of $SrTiO_3$ contributes to proportional improvements of dielectric constant, proportions in excess of 10 mol percent decrease Kr to less than 40%. Curves D and E of FIG. 3 show the relation between the proportion of $SrTiO_3$ and Kr of two materials of this invention when a portion of $PbTiO_3$ is substituted by $SrTiO_3$ of varying proportions. Curve D shows the result of measurement made on a material consisting of 48 mol percent of $PbTiO_3$, 3 mol percent of $Sr(YNb)_{0.5}O_3$ and the balance of $PbZrO_3$ whereas curve E shows that of a material consisting of 43 mol percent of $PbiTO_3$, 3 mol percent of $Sr(YNb)_{0.5}O_3$ and the remainder of $PbZrO_3$, in both materials a portion of $PbTiO_3$ being substituted by varying proportions of $SrTiO_3$. While there is a slight difference dependent upon variations in composition where the proportion of $SrTiO_3$ exceeds 10 mol percent, Kr of the material is lowered to less than 40%.

The novel piezoelectric materials can be manufactured by powder metallurgy techniques like conventional materials of the same type. According to the most common method a granular material of the average particle size of about 0.5 to 1 micron is used as the raw material which is moulded into the desired configuration, and then sintered at a temperature ranging from 1200 to 1300° C., for example. In order to facilitate moulding, the raw material may contain a resinous binder such as an aqueous solution of polyvinyl alcohol. This resinous binder undergoes decomposition and vaporises off from the raw material when heated to the sintering temperature.

The raw material may be a mixture including compounds each of which contains element in such proportions as to produce above described oxide upon sintering. Generally the compound may be oxides, hydrozides, carbonates or oxalates. Preferably, after mixing, these compounds are burned prior to sintering at a temperature ranging from 600 to 900° C. and then pulverized.

It is advantageous to sinter the raw material in a sealed furnace in order to avoid variation of the proportion of components due to vaporisation.

When compared with materials of conventional composition prepared from powdered raw materials having the same particle size and sintered at the same temperature, the sintered materials of this invention have a considerably larger bulk density. It is presumed that this is caused by the fact that presence of $Sr(MeNb)_{0.5}O_3$ having the perovskite structure contributes to the improvement of the sinterability of the raw material. (For example, $Sr(MeNb)_{0.5}O_3$ has the perovskite structure wherein the lattice constant $a$ is equal to 8.24 angstroms.) Thus, for example, where use is made of a raw material having an average particle size of 0.5 to 1 micron, the material sintered at a temperature ranging from 1250 to 1300° C. has a bulk density of 7.5 g./cm.$^3$ or higher. This should be compared with materials of conventional compositions having bulk densities of approximately 7.0 g./cm.$^3$ even when sintered at temperatures up to 1300° C. Such an excellent sintability permits applying lower sintering temperatures whereby loss of most volatile PbO can be avoided.

Materials of this invention have another advantage in that the variation in piezoeletcric characteristic with the variation of the proportion of the components is very small. This alleviates conditions for mixing the raw material and for sintering thus assuring materials having uniform piezoelectric characteristics. Generally, from the result of experiment, variations in the proportion of the respective components of less than ±0.5 mol percent does not materially affect the piezoelectric characteristic of the material. Further with respect to the piezoelectric characteristic the novel materials are stable against temperature variation as well as lapse of time after pulverisation, such a stability contributes to improve reliability of the material.

The following specific examples are given by way of illustration and are not to be construed as limiting in any way the specific scope and spirit of the invention. In the examples, bulk density is given by a value at 26° C. whereas dielectric constant and dielectric loss are given by values measured by an alternating current having a frequency of 1 kc./sec.

EXAMPLE 1

203.2 g. of PbO, 9.32 g. of SrO, 35.9 g. of $TiO_2$, 62.8 g. of $ZrO_2$, 2.27 g. of $Y_2O_3$ and 2.66 g. of $Nb_2O_5$ were mixed and pulverised in a ball mill, burned at a temperature of 850° C. for 60 minutes and again pulverised in a ball mill. The average particle size of this powder was about 1 micron. The powder was then mixed with a suitable quantity of an aqueous solution of polyvinyl alcohol and moulded into a circular disc having a diameter of 13 mm. and a thickness of 1 mm., under a pressure of 1000 kg./cm.$^2$. The disc was sintered in a sealed furnace by heating it to a temperature of 1250° C. for approximately one hour. The disc obtained had a bulk density of 7.61 g./cm.$^2$, a Curie temperature (Tc) of 295° C., and a composition consisting of 40.0 mol percent of $PbTiO_3$, 5 mol percent of $SrTiO_3$, 4.0 mol percent of $Sr(Ynb)_{0.5}O_3$ and the remainder of $PbZrO_3$. A pair of electrodes were attached to this disc to measure its dielectric properties, and obtained as dielectric constant ($\epsilon$) of 1430 and dielectric loss (tan $\delta$) of 1.5%.

This disc was further polarised at 140° C. by applying a DC voltage of 4 kv. across it for one hour. After standing it in atmospheric air for one week its piezoelectric characteristics were measured and obtained the following result:

Electro-mechanical coupling coefficient (Kr): 54.7% (27° C.) Mechanical quality factor (Qm): 130

EXAMPLE 2

Similar to Example 1, 203.4 g. of PbO, 10.9 g. of SrO, 38.0 g. of $TiO_2$, 56.8 g. of $ZrO_2$, 1.39 g. of $In_2O_3$ and 1.33 g. of $Nb_2O_5$ were burned and pulverised. The granular raw material obtained was molded into a disc having a diameter of 13 mm. and a thickness of 1 mm. under a pressure of 1000 kg./cm.$^2$. This disc was sintered by heating to a temperature of 1290° C. for 90 minutes. The sintered disc had a composition consisting of 46.5 mol percent of $PbTiO_3$, 8.5 mol percent of $SrTiO_3$, 2 mol percent of $Sr(InNb)_{0.5}O_3$, and balance of $PbZrO_3$. Its bulk density D was 7.63 g./cm.$^2$ and its Curie temperature Tc was 285° C. Electrical characteristics were as follows:

$\epsilon$—1820
tan $\delta$—2.1%
$\rho$—$10^{10}$ ohm-cm.
Kr—45.6%
$Q_m$—185

EXAMPLE 3

Similar to Example 1, 216.5 g. of PbO, 2.60 g. of SrO 37.7 g. of $TiO_2$, 63.1 g. of $ZrO_2$, 2.05 g. of $Lu_2O_3$ and 1.65 g. of $Nb_2O_5$ were burned, moulded and then sintered at a temperature of 1250° C. for 2 hours. A resulted circular disc shaped piezoelectric material had a bulk density of 7.67 g./cm.$^3$, and a Curie temperature of 310° C. Electrical characteristics were:

$\epsilon$—1280
tan $\delta$—2.5%
$\rho$—$10^{11}$ ohm-cm.
Kr—51.8%
$Q_m$—158

EXAMPLE 4

215.7 g. of PbO, 3.20 g. of SrO, 36.8 g. of $TiO_2$, 63.2 g. of $ZrO_2$, 1.92 g. of $Nb_2O_5$ and 2.51 g. of $Nd_2O_3$ were pulverised and mixed in a ball mill, burned at a temperature of about 800° C., moulded into a circular disc having a diameter of 13 mm. and a thickness of 1 mm. under a pressure of 1000 kg./cm.$^2$ and sintered by heating to a temperature of 1290° C. for one hour. The composition of this disc was comprised by 46.0 mol percent of $PbTiO_3$, 3.0 mol percent of $Sr(NdNb)_{0.5}O_3$ and the remainder of $PbZrO_3$.

EXAMPLE 5

The process described in Example 4 was repeated except that $Nd_2O_3$ was substituted by 2.55 g. of $Sm_2O_3$ and obtained a circular disc having a composition consisting of 46.0 mol percent of $PbTiO_3$, 3.0 mol percent of $$Sr(SmNb)_{0.5}O_3$$

and the remainder of $PbZrO_3$.

EXAMPLE 6

The process described in Example 4 was repeated except that 2.61 g. of $Tb_2O_3$ was substituted for $Nd_2O_3$ and a similar ceramic containing 3.0 mol percent of $$Sr(TbNb)_{0.5}O_3$$

was obtained.

EXAMPLE 7

Again the process described in Example 4 was repeated except that in lieu of $Nd_2O_3$, 2.64 g. of $Dy_2O_3$ was used and a similar ceramic containing 3.0 mol percent of $Sr(DyNb)_{0.5}O_3$ was obtained.

EXAMPLE 8

Also in this example the process described in Example 4 was repeated except that in lieu of $Nd_2O_3$, 2.68 g. of $Ho_2O_3$ was used to obtain a similar piezoelectric material containing 3.0 mol percent of $Sr(HoNb)_{0.5}O_3$ was obtained.

EXAMPLE 9

Again the method described in Example 4 was used except that $Nd_2O_3$ was replaced by 2.71 g. of $Tm_2O_3$ to prepare a similar ceramic containing 3.0 mol percent of $Sr(TmNb)_{0.5}O_3$.

EXAMPLE 10

In this example to the process described in Example 4 was used except that 2.49 g. of $La_2O_3$ was used instead of $Nd_2O_3$ to obtain a similar ceramic containing 3.0 mol percent of $Sr(LaNb)_{0.5}O_3$.

EXAMPLE 11

The piezoelectric material containing 3.0 mol percent of $Sr(EuNb)_{0.5}O_3$ was prepared from the same raw mixture as Example 1 except that $Nd_2O_3$ was replaced by 2.58 g. of $Eu_2O_3$.

| | D (g./cm.$^3$) | $\epsilon$ | Kr, percent | $Q_m$ |
|---|---|---|---|---|
| Example: | | | | |
| 4 | 7.64 | 1,375 | 55.8 | 196 |
| 5 | 7.59 | 1,315 | 57.4 | 153 |
| 6 | 7.56 | 1,285 | 56.2 | 153 |
| 7 | 7.55 | 1,265 | 55.3 | 166 |
| 8 | 7.65 | 1,320 | 54.4 | 172 |
| 9 | 7.58 | 1,305 | 55.1 | 122 |
| 10 | 7.58 | 1,310 | 55.3 | 116 |
| 11 | 7.63 | 1,350 | 56.6 | 131 |

EXAMPLE 12

As in Example 1, a mixture consisting of 204.8 g. of PbO, 8.16 g. of SrO, 33.2 g. of $TiO_2$, 66.0 g. of $ZrO_2$, 3.31 g. of $Nb_2O_5$ and 4.91 g. of $Er_2O_3$ was used, the mixture was burned and moulded into a circular disc having a diameter of 13 mm. and a thickness of 1 mm. and sintered at a temperature of 1300° C. The sintered disc had a composition consisting of 38.5 mol percent of $PbTiO_3$, 3.0 mol percent of $SrTiO_3$, 5.0 mol percent of $Sr(ErNb)_{0.5}O_3$ and the remainder of $PbZrO_3$, and had the following physical characteristics:

D—7.75 g./cm.$^3$
Tc—295° C.
$\epsilon$—1590
tan $\delta$—3.3%
$\rho$—$10^{11}$ ohm-cm.
Kr—47.3%
$Q_m$—250

EXAMPLE 13

A mixture consisting of 217.7 g. of PbO, 2.58 g. of SrO, 35.5 g. of $TiO_2$, 67.1 g. of $ZrO_2$, 0.65 g. of $Nb_2O_5$ and 0.92 g. of $Gd_2O_3$ was moulded into a circular disc of 13 mm. diameter and 1 mm. thick under the same conditions as in Example 1. The disc was sintered at 1260° C. for 90 minutes, the disc shaped piezoelectric material had composition consisting of 43.0 mol percent of $PbTiO_3$, 1.5 mol percent of $SrTiO_3$, 1.0 mol percent $Sr(GdNb)_{0.5}O_3$ and the rest of $PbZrO_3$, and had the following characteristics:

D—7.80 g./cm.$^3$
Tc—300° C.
$\epsilon$—1410
tan $\delta$—2.5%
$\rho$—$10^{11}$ ohm-cm.
Kr—47.3%
$Q_m$—250

What is claimed is:

1. A piezoelectric ceramic selected from the group consisting of materials consisting of from 40 to 50 mol percent of $PbTiO_3$, from 0.5 to 6 mol percent of a compound represented by a general formula $$Sr(MeNb)_{0.5}O_3$$

where Me is an element selected from the group consisting of In, Y, La, Nd, Sm, Eu, Gd, Tb, Dy, Ho, Er, Tm, Yb and Lu, and the remainder of $PbZrO_3$ and such materials wherein a portion of said $PbTiO_3$ is replaced by $SrTiO_3$ of the proportion not exceeding 10 mol percent based on the total quantity of said materials.

2. The piezoelectric ceramic materials according to claim 1 wherein a portion of said $PbTiO_3$ is replaced by $SrTiO_3$ of the proportion not exceeding 10 mol percent based on the total quantity of said materials.

References Cited

UNITED STATES PATENTS 3,068,177 12/1962 Sugden ............ 252—62.9
3,268,453 8/1966 Ouchi et al. ........ 252—62.9
3,268,783 8/1966 Saburi ............ 106—39 X TOBIAS E. LEVOW, Primary Examiner J. COOPER, Assistant Examiner U.S. Cl. X.R.

106—39